(12) United States Patent
Na et al.

(10) Patent No.: US 11,974,476 B2
(45) Date of Patent: *Apr. 30, 2024

(54) ORGANIC LIGHT-EMITTING DISPLAY APPARATUS WITH MESH STRUCTURED LINE BETWEEN VIA LAYERS

(71) Applicant: Samsung Display Co., Ltd., Yongin-si (KR)

(72) Inventors: Jisu Na, Yongin-si (KR); Youngjin Cho, Yongin-si (KR); Yangwan Kim, Yongin-si (KR); Joongsoo Moon, Yongin-si (KR); Keunsoo Lee, Yongin-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 0 days.

This patent is subject to a terminal disclaimer.

(21) Appl. No.: 18/075,370

(22) Filed: Dec. 5, 2022

(65) Prior Publication Data

US 2023/0095936 A1    Mar. 30, 2023

Related U.S. Application Data

(63) Continuation of application No. 17/020,159, filed on Sep. 14, 2020, now Pat. No. 11,527,602, which is a
(Continued)

(30) Foreign Application Priority Data

Mar. 29, 2019    (KR) .................. 10-2019-0037313

(51) Int. Cl.
*H10K 59/131* (2023.01)
*H10K 59/122* (2023.01)
(Continued)

(52) U.S. Cl.
CPC ......... *H10K 59/131* (2023.02); *H10K 59/122* (2023.02); *H10K 59/124* (2023.02);
(Continued)

(58) Field of Classification Search
CPC .. H10K 59/131; H10K 59/353; H10K 59/122; H10K 59/126; H10K 59/352; H10K 59/124

See application file for complete search history.

(56) References Cited

U.S. PATENT DOCUMENTS 9,984,627 B2    5/2018    Fujimura et al.
10,304,388 B2    5/2019    Lee et al.
(Continued)

FOREIGN PATENT DOCUMENTS

EP    3293767    3/2018
EP    3346502    7/2018
(Continued)

OTHER PUBLICATIONS

Notice of Allowance dated May 13, 2020, in U.S. Appl. No. 16/821,998.
(Continued)

*Primary Examiner* — Lex H Malsawma
(74) *Attorney, Agent, or Firm* — KILE PARK REED & HOUTTEMAN PLLC

(57) ABSTRACT

An organic light-emitting display apparatus includes a substrate, pixels, a pixel defining layer (PDL), a first via layer, a second via layer, first lines, and a second line. The pixels are arranged on the substrate in a first direction (D1) and a second direction (D2) intersecting one another, and include organic light-emitting diodes (OLEDs). The OLEDs include pixel electrodes (PEs). The PDL covers edges of the PEs and defines light-emitting regions via openings partially exposing the PEs. The first and second via layers are between the PEs and the substrate. The first lines extend in the D2 between the first via layer and the substrate. The second line is between the second and first via layers. The second line at least partially extends around the light-emitting regions. The second line contacts the first lines through via holes. Each via hole is provided every two pixels arranged in the D2.

20 Claims, 11 Drawing Sheets

Related U.S. Application Data continuation of application No. 16/821,998, filed on Mar. 17, 2020, now Pat. No. 10,818,745.

(51) Int. Cl.
  *H10K 59/124* (2023.01)
  *H10K 59/126* (2023.01)
  *H10K 59/35* (2023.01)

(52) U.S. Cl.
  CPC ......... *H10K 59/126* (2023.02); *H10K 59/352* (2023.02); *H10K 59/353* (2023.02)

(56) References Cited

U.S. PATENT DOCUMENTS

| | | | |
|---|---|---|---|
| 10,818,745 | B2 | 10/2020 | Na et al. |
| 11,527,602 | B2 * | 12/2022 | Na ................. H10K 59/124 |
| 2016/0099300 | A1 | 4/2016 | Lee et al. |
| 2016/0124557 | A1 | 5/2016 | Choi |
| 2017/0062545 | A1 | 3/2017 | Oh et al. |
| 2018/0076273 | A1 | 3/2018 | Kim et al. |
| 2018/0218684 | A1 | 8/2018 | Choi et al. |
| 2018/0240856 | A1 | 8/2018 | Kim et al. |
| 2019/0312097 | A1 | 10/2019 | Choi et al. |
| 2019/0369784 | A1 | 12/2019 | Yao et al. |

FOREIGN PATENT DOCUMENTS

| | | |
|---|---|---|
| EP | 3401959 | 11/2018 |
| JP | 2017-062374 | 3/2017 |
| KR | 10-2015-0079252 | 7/2015 |
| KR | 10-2018-0030363 | 3/2018 |
| KR | 10-2018-0089928 | 8/2018 |
| KR | 10-2018-0110258 | 10/2018 |

OTHER PUBLICATIONS

Non-Final Office Action dated Apr. 13, 2022, in U.S. Appl. No. 17/020,159.

Notice of Allowance dated Aug. 10, 2022, in U.S. Appl. No. 17/020,159.

\* cited by examiner

ORGANIC LIGHT-EMITTING DISPLAY APPARATUS WITH MESH STRUCTURED LINE BETWEEN VIA LAYERS

CROSS-REFERENCE TO RELATED APPLICATION

This application is a Continuation of U.S. patent application Ser. No. 17/020,159, filed Sep. 14, 2020, which is a Continuation of U.S. patent application Ser. No. 16/821,998, filed Mar. 17, 2020, and claims priority to and the benefit of Korean Patent Application No. 10-2019-0037313, filed Mar. 29, 2019, each of which is hereby incorporated by reference for all purposes as if fully set forth herein.

BACKGROUND

Field

One or more exemplary embodiments generally relate to an organic light-emitting display apparatus.

Discussion

Organic light-emitting display apparatuses typically include two electrodes and an organic light-emitting layer between the two electrodes. In a conventional organic light-emitting display apparatus, electrons injected through a cathode (e.g., one or a first electrode) and holes injected through an anode (e.g., another or a second electrode) are combined in an organic light-emitting layer to form excitons. The excitons emit light while discharging energy.

An organic light-emitting display apparatus may include a plurality of pixels each including an organic light-emitting diode (OLED) in which a cathode, an anode, and an organic light-emitting layer are included, and each pixel may further include a plurality of transistors and a capacitor for driving the OLED. The plurality of transistors may include a switching transistor and a driving transistor. Such an organic light-emitting display apparatus may have a relatively fast response speed and may be driven with relatively low power consumption. It is noted, however, that as resolution increases, an OLED, a plurality of transistors driving the OLED, a capacitor, and wires transferring signals may overlap one another, and, accordingly, various issues may occur.

The above information disclosed in this section is only for understanding the background of the inventive concepts, and, therefore, may contain information that does not form prior art.

SUMMARY

One or more exemplary embodiments provide an organic light-emitting display apparatus capable of reducing an asymmetric color shift effect and ensure excellent visibility, while also reducing a variation in characteristics of pixels.

Additional aspects will be set forth in the detailed description which follows, and, in part, will be apparent from the disclosure, or may be learned by practice of the inventive concepts.

According to some exemplary embodiments, an organic light-emitting display apparatus includes a substrate, pixels, a pixel defining layer, a first via layer, a second via layer, first lines, and a second line. The pixels are arranged on the substrate in a first direction and a second direction intersecting the first direction. The pixels include organic light-emitting diodes. The organic light-emitting diodes include pixel electrodes. The pixel defining layer covers edges of the pixel electrodes. The pixel defining layer defines light-emitting regions via openings partially exposing the pixel electrodes. The first via layer and the second via layer are between the pixel electrodes and the substrate. The first lines extend in the second direction between the first via layer and the substrate. The second line is between the second via layer and the first via layer. The second line at least partially extends around the light-emitting regions. The second line contacts the first lines through via holes. Each via hole among the via holes is provided every two pixels arranged in the second direction among the pixels.

According to some exemplary embodiments, an organic light-emitting display apparatus includes a substrate, pixels, a pixel defining layer, a first via layer, a second via layer, first lines, and a second line. The pixels are arranged on the substrate in a first direction and a second direction intersecting the first direction. The pixels include organic light-emitting diodes. The organic light-emitting diodes include pixel electrodes. The pixel defining layer covers edges of the pixel electrodes. The pixel defining layer defines light-emitting regions via openings partially exposing the pixel electrodes. The first via layer and the second via layer are between the pixel electrodes and the substrate. The first lines extend in the second direction between the first via layer and the substrate. The second line is between the second via layer and the first via layer. The second line at least partially extends around the light-emitting regions. The second line contacts the first lines through via holes. The pixels comprise a first pixel, a second pixel, and a third pixel each of which is configured to emit light of a different color. The via holes are provided closer to the light-emitting regions of the first pixel and the second pixel than to the third pixel.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts. In the drawings.

DETAILED DESCRIPTION OF SOME EXEMPLARY EMBODIMENTS

Figure 1:
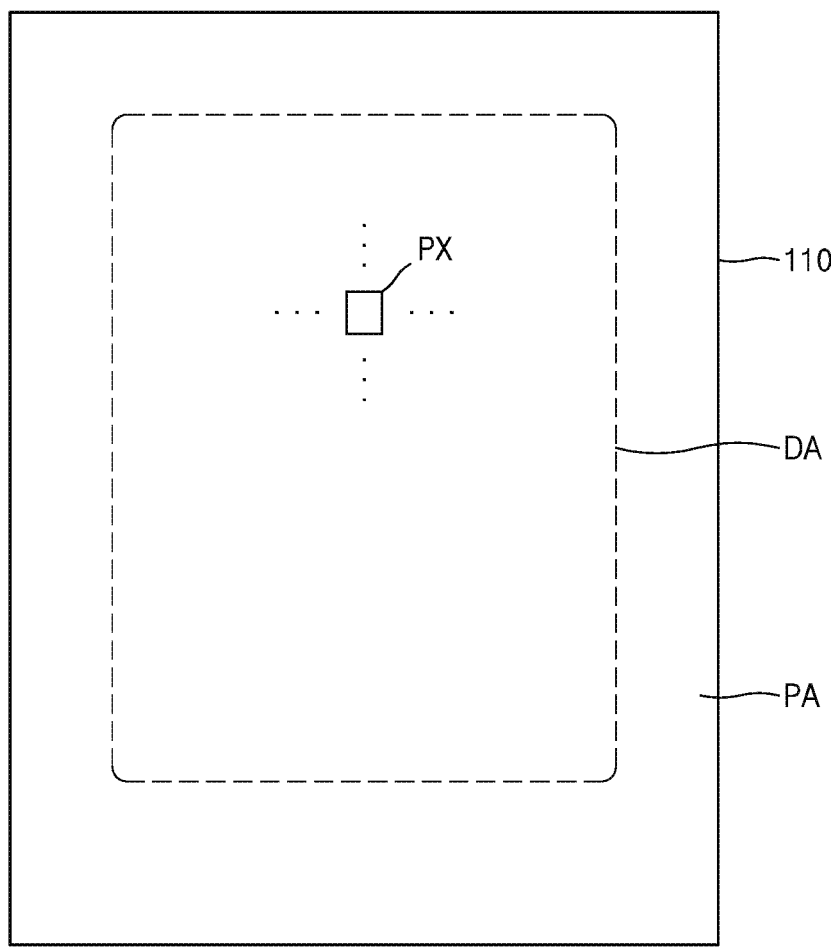
FIG. 1 is a plan view of a display apparatus according to some exemplary embodiments.

In the following description, for the purposes of explanation, numerous specific details are set forth in order to provide a thorough understanding of various exemplary embodiments. As used herein, the terms "embodiments" and "implementations" are used interchangeably and are non-limiting examples employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some exemplary embodiments. Therefore, unless otherwise specified, the features, components, modules, layers, films, panels, regions, aspects, etc. (hereinafter individually or collectively referred to as an "element" or "elements"), of the various illustrations may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. As such, the sizes and relative sizes of the respective elements are not necessarily limited to the sizes and relative sizes shown in the drawings. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. Other terms and/or phrases used to describe a relationship between elements should be interpreted in a like fashion, e.g., "between" versus "directly between," "adjacent" versus "directly adjacent," "on" versus "directly on," "electrically connected" versus "directly electrically connected," "formed on" versus "directly formed on," etc. Further, the term "connected" may refer to physical, electrical, and/or fluid connection. In addition, the first directional axis, the second directional axis, and the third directional axis are not limited to three axes of a rectangular coordinate system, and may be interpreted in a broader sense. For example, the first directional axis, the second directional axis, and the third directional axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional views, isometric views, perspective views, plan views, and/or exploded illustrations that are schematic illustrations of idealized exemplary embodiments and/or intermediate structures. As such, variations from the shapes of the illustrations as a result of, for example, manufacturing techniques and/or tolerances, are to be expected. Thus, exemplary embodiments disclosed herein should not be construed as limited to the particular illustrated shapes of regions, but are to include deviations in shapes that result from, for instance, manufacturing. To this end, regions illustrated in the drawings may be schematic in nature and shapes of these regions may not reflect the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the inventive concepts. Further, the blocks, units, and/or modules of some exemplary embodiments may be physically combined into more complex blocks, units, and/or modules without departing from the inventive concepts.

Hereinafter, various exemplary embodiments will be explained in detail with reference to the accompanying drawings.

FIG. 1 is a plan view of a display apparatus according to some exemplary embodiments.

Referring to FIG. 1, the organic light-emitting display apparatus includes a display area DA for realizing (e.g., displaying) images and a peripheral area PA that is a non-display area outside (e.g., around) the display area DA. A plurality of pixels PX are arranged in the display area DA to provide images, e.g., predetermined images.

Each pixel PX may emit light of at least one color, such as, for example, red light, green light, blue light, and/or white light, and, for instance, may include an organic light-emitting diode OLED. In addition, each pixel PX may further include devices, such as a thin film transistor (TFT), capacitor, etc. In this specification, the pixel PX may denote a sub-pixel emitting one of red light, green light, blue light, and white light as previously described.

The peripheral area PA does not provide images, and, although not shown, may include a scan driver, a data driver, etc., for providing electric signals to the pixels PX of the display area DA and power lines for providing electric power, such as a driving voltage and a common voltage. Also, the peripheral area PA may include a terminal portion to which a printed circuit board, etc. may be connected.

Figure 2A:
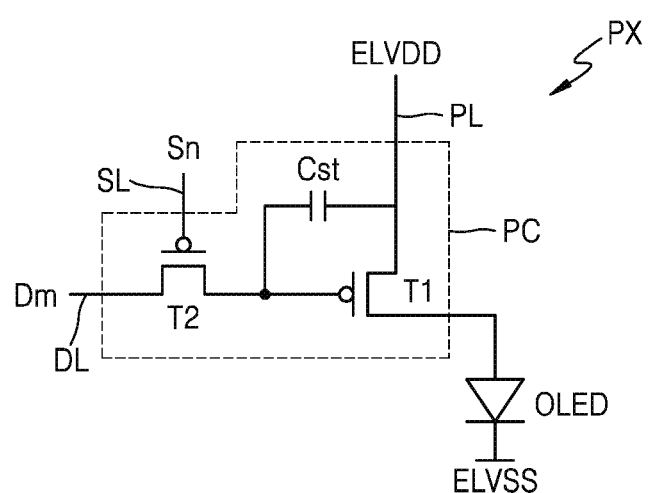
FIGS. 2A and 2B are equivalent circuit diagrams of a pixel in a display apparatus according to various exemplary embodiments.
Figure 2B:
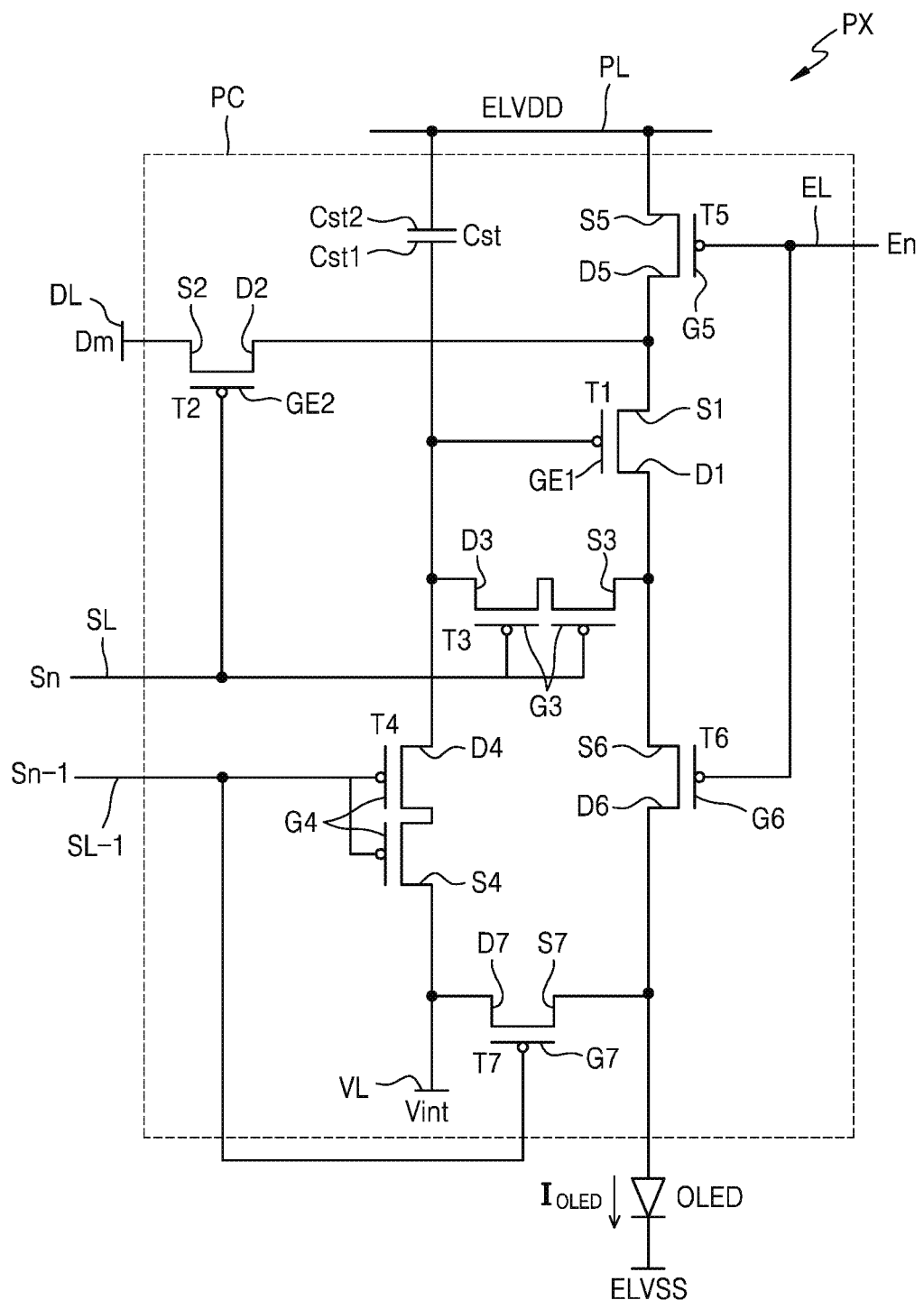

FIGS. 2A and 2B are equivalent circuit diagrams of a pixel in a display apparatus according to various exemplary embodiments.

Referring to FIG. 2A, each pixel PX may include a pixel circuit PC connected to a scan line SL and a data line DL, and an organic light-emitting diode OLED connected to the pixel circuit PC.

The pixel circuit PC includes a driving TFT T1, a switching TFT T2, and a storage capacitor Cst. The switching TFT T2 is connected to the scan line SL and the data line DL and transfers a data signal Dm input through the data line DL to the driving TFT T1 according to a scan signal Sn input through the scan line SL.

The storage capacitor Cst is connected to the switching TFT T2 and a driving voltage line PL and stores a voltage corresponding to a difference between a voltage transferred from the switching TFT T2 and a first power voltage ELVDD (or a driving voltage) supplied to the driving voltage line PL.

The driving TFT T1 is connected to the driving voltage line PL and the storage capacitor Cst and may control a driving current flowing from the driving voltage line PL to the organic light-emitting diode OLED in response to the voltage value stored in the storage capacitor Cst. The organic light-emitting diode OLED may be connected between the driving TFT T1 and a second power voltage ELVSS (or a common voltage). The organic light-emitting diode OLED may emit light having a predetermined luminance according to the driving current.

FIG. 2A shows an example in which the pixel circuit PC includes two thin film transistors and one storage capacitor, but one or more exemplary embodiments are not limited thereto. The pixel circuit PC may be variously modified. For instance, the pixel circuit PC may include three or more thin film transistors and/or two or more storage capacitors. For example, the pixel circuit PC may include seven thin film transistors and one storage capacitor, such as shown in FIG. 2B.

Referring to FIG. 2B, each pixel PX includes the pixel circuit PC and the organic light-emitting diode OLED connected to the pixel circuit PC. The pixel circuit PC may include a plurality of thin film transistors and a storage capacitor. The thin film transistors and the storage capacitor may be connected to signal lines SL, SL-1, EL, and DL, an initialization voltage line VL, and a driving voltage line PL.

In FIG. 2B, each pixel PX is connected to the signal lines SL, SL-1, EL, and DL, the initialization voltage line VL, and the driving voltage line PL, but one or more exemplary embodiments are not limited thereto. As another exemplary embodiment, at least one of the signal lines SL, SL-1, EL, and DL, the initialization voltage line VL, and the driving voltage line PL may be shared by at least one neighboring pixel P.

The plurality of thin film transistors may include a driving TFT T1, a switching TFT T2, a compensation TFT T3, a first initialization TFT T4, an operation control TFT T5, an emission control TFT T6, and a second initialization TFT T7.

The signal lines include the scan line SL transferring a scan signal Sn, a previous scan line SL-1 transferring a previous scan signal Sn-1 to the first initialization TFT T4 and the second initialization TFT T7, an emission control line EL transferring an emission control signal En to the operation control TFT T5 and the emission control TFT T6, and a data line DL intersecting with the scan line SL and transferring a data signal Dm. The driving voltage line PL transfers the driving voltage ELVDD to the driving TFT T1, and the initialization voltage line VL transfers an initialization voltage Vint for initializing the driving TFT T1 and a pixel electrode of the organic light-emitting diode OLED.

A driving gate electrode GE1 of the driving TFT T1 is connected to a first electrode Cst1 of the storage capacitor Cst, a driving source electrode S1 of the driving TFT T1 is connected to the driving voltage line PL via the operation control TFT T5, and a driving drain electrode D1 of the driving TFT T1 is electrically connected to a pixel electrode of the organic light-emitting diode OLED via the emission control TFT T6. The driving TFT T1 receives the data signal Dm according to a switching operation of the switching TFT T2 to supply a driving current $I_{OLED}$ to the organic light-emitting diode OLED.

A switching gate electrode GE2 of the switching TFT T2 is connected to the scan line SL, a switching source electrode S2 of the switching TFT T2 is connected to the data line DL, and a switching drain electrode D2 of the switching TFT T2 is connected to the driving source electrode S1 of the driving TFT T1 and, at the same time, is connected to the driving voltage line PL via the operation control TFT T5. The switching TFT T2 is turned on according to the scan signal Sn received through the scan line SL and performs a switching operation that transfers the data signal Dm transferred through the data line DL to the driving source electrode S1 of the driving TFT T1.

A compensation gate electrode G3 of the compensation TFT T3 is connected to the scan line SL, a compensation source electrode S3 of the compensation TFT T3 is connected to the driving drain electrode D1 of the driving TFT T1 and, at the same time, is connected to one electrode (e.g., a pixel electrode) of the organic light-emitting diode OLED via the emission control TFT T6, and a compensation drain electrode D3 of the compensation TFT T3 is connected to the first electrode Cst1 of the storage capacitor Cst, a first initialization drain electrode D4 of the first initialization TFT T4, and the driving gate electrode GE1 of the driving TFT T1. The compensation TFT T3 is turned on according to the scan signal Sn received through the scan line SL to electrically connect the driving gate electrode GE1 and the driving drain electrode D1 of the driving TFT T1 to each other and to diode-connect the driving TFT T1.

A first initialization gate electrode G4 of the first initialization TFT T4 is connected to the previous scan line SL-1, a first initialization source electrode S4 of the first initialization TFT T4 is connected to a second initialization drain electrode D7 of the second initialization TFT T7 and the initialization voltage line VL, and the first initialization drain electrode D4 of the first initialization TFT T4 is connected to the first electrode Cst1 of the storage capacitor Cst, the compensation drain electrode D3 of the compensation TFT T3, and the driving gate electrode GE1 of the driving TFT T1. The first initialization TFT T4 is turned on according to a previous scan signal Sn-1 transferred through the previous scan line SL-1 to transfer the initialization voltage Vint to the driving gate electrode GE1 of the driving TFT T1 and perform an initialization operation for initializing a voltage at the driving gate electrode GE1 of the driving TFT T1.

An operation control gate electrode G5 of the operation control TFT T5 is connected to the emission control line EL, an operation control source electrode S5 of the operation control TFT T5 is connected to the driving voltage line PL and an operation control drain electrode D5 of the operation control TFT T5 is connected to the driving source electrode S1 of the driving TFT T1 and the switching drain electrode D2 of the switching TFT T2.

An emission control gate electrode G6 of the emission control TFT T6 is connected to the emission control line EL, an emission control source electrode S6 of the emission control TFT T6 is connected to the driving drain electrode D1 of the driving TFT T1 and the compensation source electrode S3 of the compensation TFT T3, and an emission control drain electrode D6 of the emission control TFT T6 is electrically connected to a second initialization source electrode S7 of the second initialization TFT T7 and one electrode (e.g., a pixel electrode) of the organic light-emitting diode OLED.

The operation control TFT T5 and the emission control TFT T6 are simultaneously turned on according to the emission control signal En transferred through the emission control line EL to transfer the driving voltage ELVDD to the organic light-emitting diode OLED and to allow a driving current $I_{OLED}$ to flow in the organic light-emitting diode OLED.

The second initialization gate electrode G7 of the second initialization TFT T7 is connected to the previous scan line SL-1, a second initialization source electrode S7 of the second initialization TFT T7 is connected to the emission control drain electrode D6 of the emission control TFT T6 and one electrode (e.g., a pixel electrode) of the organic light-emitting diode OLED, and a second initialization drain electrode D7 of the second initialization TFT T7 is connected to the first initialization source electrode S4 of the first initialization TFT T4 and the initialization voltage line VL. The second initialization TFT T7 is turned on according to the previous scan signal Sn-1 transferred through the previous scan line SL-1 to initialize the organic light-emitting diode OLED.

FIG. 2B shows a case in which the first initialization thin film transistor T4 and the second initialization thin film transistor T7 are connected to the previous scan line SLn-1, but one or more exemplary embodiments are not limited thereto. As another exemplary embodiment, the first initialization TFT T4 may be connected to the previous scan line SL-1 to operate according to the previous scan signal Sn-1, and the second initialization TFT T7 may be connected to a separate signal line (e.g., a post scan line) to operate according to a signal transferred to the separate signal line.

A second electrode Cst2 of the storage capacitor Cst is connected to the driving voltage line PL, and an opposite electrode (e.g., a cathode) of the organic light-emitting diode OLED is connected to a common voltage ELVSS. Accordingly, the organic light-emitting diode OLED emits light by receiving the driving current $I_{OLED}$ from the driving TFT T1 to display images.

In FIG. 2B, the compensation TFT T3 and the first initialization TFT T4 have dual-gate electrode structures, but the compensation TFT T3 and the first initialization TFT T4 may each have one gate electrode.

Figure 3:
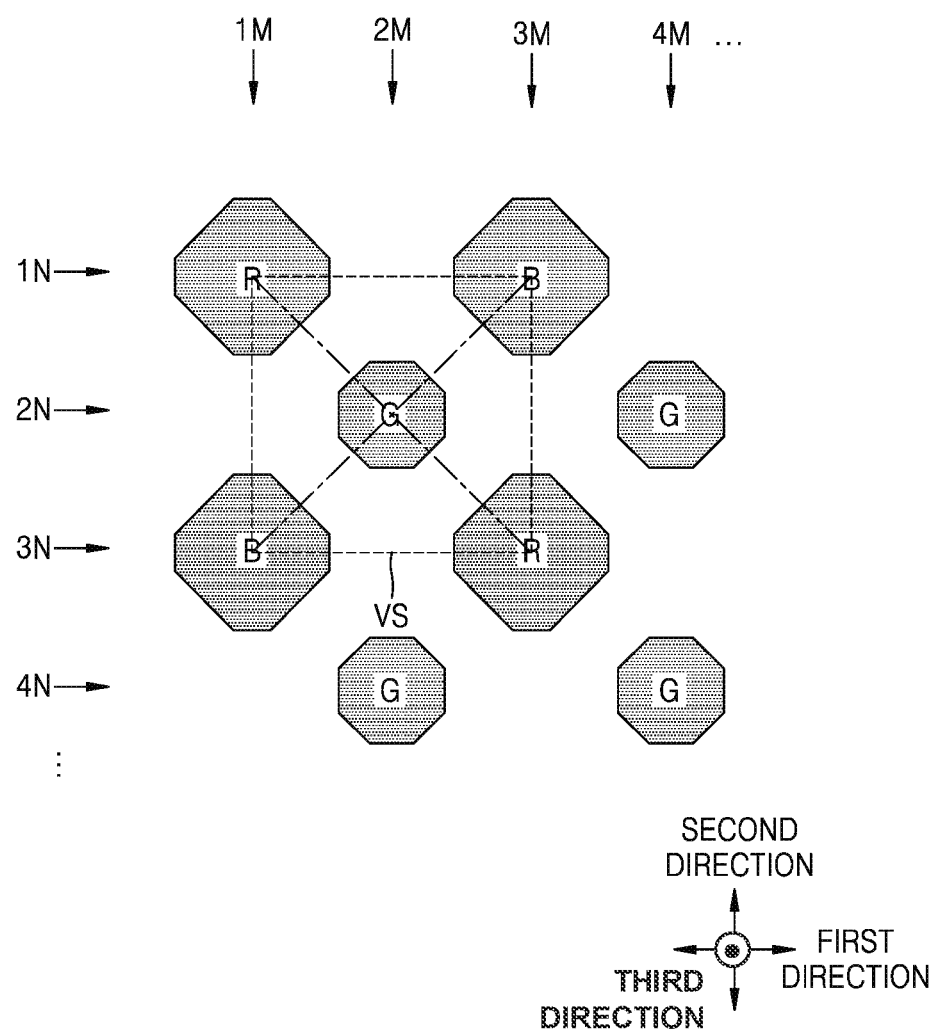
FIG. 3 is a schematic diagram showing light-emitting regions of a plurality of pixels in an organic light-emitting display apparatus according to some exemplary embodiments.

FIG. 3 is a schematic diagram showing light-emitting regions of a plurality of pixels in an organic light-emitting display apparatus according to some exemplary embodiments. For instance, FIG. 3 is a schematic diagram showing light-emitting regions of a plurality of pixels R, G, and B in an organic light-emitting display apparatus. In some exemplary embodiments, a red pixel R, a green pixel G, and a blue pixel B respectively denote light-emitting regions of each pixel PX, and the light-emitting region may be defined by an opening of (or in) a pixel defining layer, as will become more apparent below.

Referring to FIG. 3, on a first row 1N, the red pixel R and the blue pixel B are alternately arranged in a first direction, and the green pixels G may be arranged with a predetermined interval in the first direction in a second row 2N adjacent to the first row 1N. Likewise, the red pixels R and the blue pixels B are alternately arranged in a third row 3N, and the green pixels G may be arranged with a predetermined interval in a fourth row 4N adjacent to the third row 3N. The aforementioned arrangement of pixels PX may be repeatedly performed on a predetermined row set in advance.

The green pixels G of the second row 2N may be staggered with the red pixels R and the blue pixels B of the first row 1N. Therefore, the red pixels R and the blue pixels B are alternately arranged in a second direction in a first column 1M, and the green pixels G may be arranged with a predetermined interval in the second direction in a second column 2M. The aforementioned arrangement of pixels PX may be repeatedly performed on a predetermined column set in advance. Here, the blue pixels B and the red pixels R may each have an area greater than that of the green pixels G. Otherwise, an area of the blue pixels B may be greater than those of the red pixels R and the green pixels G.

According to some exemplary embodiments, from among vertexes of a virtual square VS having the green pixel G as a center thereof, the red pixels R are arranged at first and third vertexes facing each other, and the blue pixels B may be arranged at remaining vertexes, e.g., second and fourth vertexes of the virtual square VS. Here, the virtual square VS may be variously modified as, for example, a rectangle, a rhombus, a square, etc.

The arrangement of the pixels PX according to various exemplary embodiments is not limited thereto. For example, the blue pixel B, instead of the green pixel G, may be arranged at the center of the virtual square VS in FIG. 3, and the red pixels R may be arranged at the first and third vertexes facing each other and the green pixels G may be arranged at the remaining second and fourth vertexes, from among the vertexes of the virtual square VS.

The above pixel arrangement structure is referred to as a PenTile matrix structure, and a rendering operation for representing colors by sharing adjacent pixels PX is applied to realize a high resolution using a small number of pixels PX.

The pixel arrangement structure according to various exemplary embodiments is not limited to a PenTile matrix structure. For example, one or more exemplary embodiments may be applied to a stripe arrangement, a mosaic arrangement, and/or a delta arrangement structure. Also, one or more exemplary embodiments may be applied to a pixel arrangement structure further including white pixels emitting white light.

In some exemplary embodiments, pixels PX may be classified as first to third pixels. In some exemplary embodiments, the first to third pixels may respectively correspond to the red pixel R, the green pixel G, and the blue pixel B.

Figure 4:
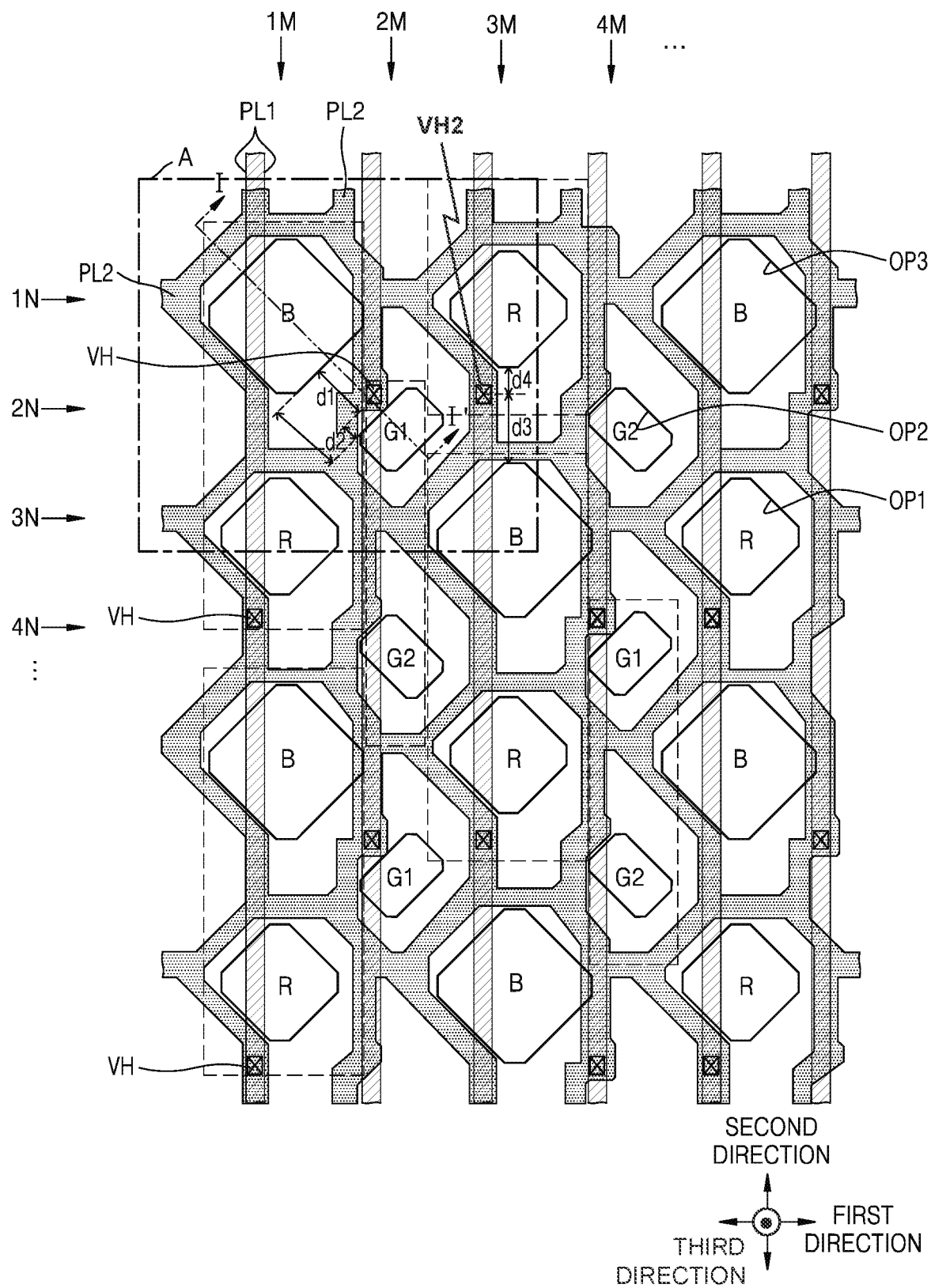
FIG. 4 is a layout showing a relation between light-emitting regions of a plurality of pixels and wires according to some exemplary embodiments.
Figure 5:
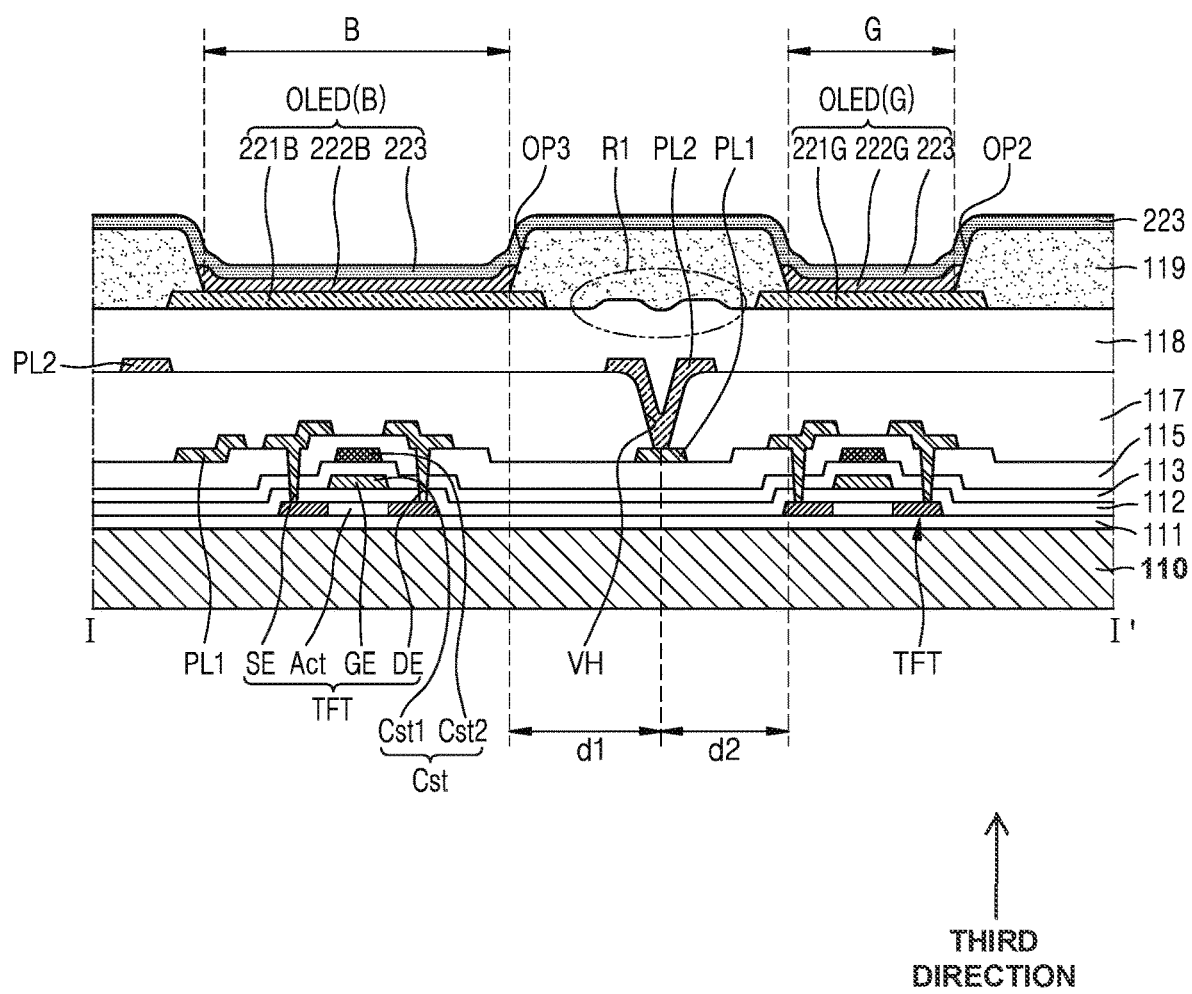
FIG. 5 is a cross-sectional view taken along sectional line I-I' in FIG. 4 according to some exemplary embodiments.
Figure 6:
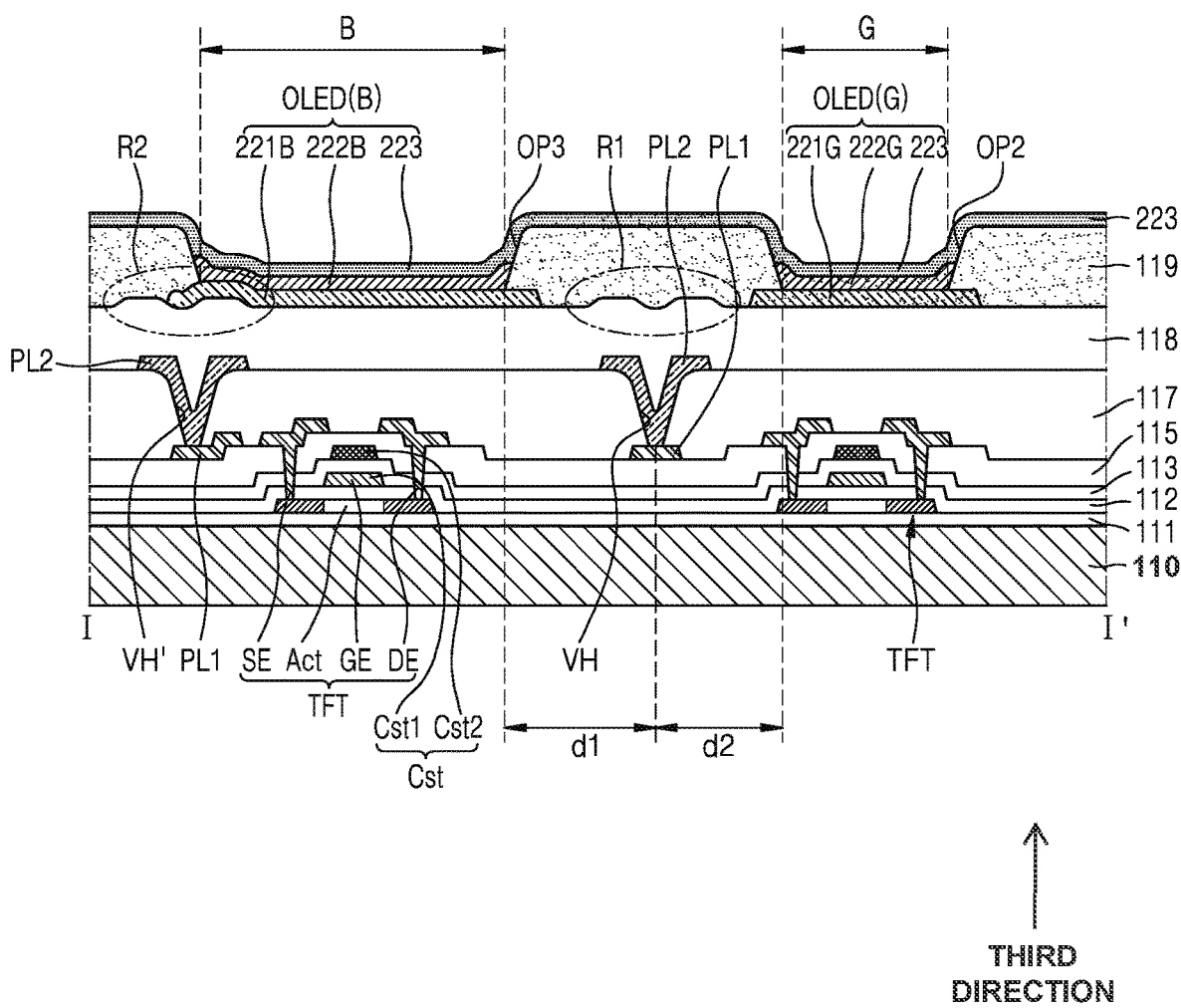
FIG. 6 is a cross-sectional view according to a comparative example for comparison with at least one exemplary embodiment.

FIG. 4 is a layout showing a relation between light-emitting regions of a plurality of pixels and wires according to some exemplary embodiments. FIG. 5 is a cross-sectional view taken along sectional line I-I' in FIG. 4 according to some exemplary embodiments. FIG. 6 is a cross-sectional view according to a comparative example for comparison with at least one exemplary embodiment.

Referring to FIG. 4, the organic light-emitting display apparatus includes a plurality of pixels, and the plurality of pixels may be connected to various wires or lines.

The plurality of pixels PX may include a plurality of red pixels R, a plurality of green pixels G, and a plurality of blue pixels B. As described above, the plurality of pixels PX may be arranged in a PenTile matrix structure.

In FIG. 4, from among various wires, a plurality of first lines PL1 overlapping light-emitting regions OP1, OP2, and OP3 of a plurality of pixels PX and second lines PL2 arranged to at least partially arch around the light-emitting regions OP1, OP2, and OP3 are shown. In some exemplary embodiments, the light-emitting regions OP1, OP2, and OP3 may be defined as openings in a pixel defining layer that will be described later.

Each of the first lines PL1 extends in the second direction and may be connected to a plurality of pixels PX arranged in one column. For example, the first line PL1 extending along the first column 1M may be connected to the blue pixels B and the red pixels R that are alternately arranged. The first line PL1 extending along the second column 2M may be connected to green pixels G1 and G2. The first lines PL1 may overlap light-emitting regions of the pixels PX on a plane. The first lines PL1 may transfer the driving voltage ELVDD (see FIGS. 2A and 2B) to the plurality of pixels PX. The first lines PL1 may be arranged with a predetermined interval in the first direction.

The second lines PL2 may be arranged in a different layer from the first lines PL1, and may be arranged to at least partially arch around the light-emitting regions OP1, OP2, and OP3 of the plurality of pixels PX. The second line PL2 may have a mesh structure. The second lines PL2 may include openings at least partially exposing the light-emitting regions OP1, OP2, and OP3. Otherwise, it may be understood that the second lines PL2 include boundary patterns corresponding to edges of the light-emitting regions OP1, OP2, and OP3 and connection patterns for connecting the boundary patterns. Here, the boundary patterns and the connection patterns of the second lines PL2 may be integrally provided. The second lines PL2 mostly do not overlap the light-emitting regions OP1, OP2, and OP3, but may partially overlap the light-emitting regions OP1, OP2, and OP3. For example, in a case of the blue pixel B having the largest light-emitting region, an end portion of the light-emitting region may partially overlap the second line PL2.

The second lines PL2 may contact the first lines PL1 via a plurality of via holes VH. Since the second lines PL2 are in contact with the first lines PL1, the second lines PL2 may provide the same voltage as that of the first lines PL1. For example, the first lines PL1 and the second lines PL2 may transmit the driving voltage ELVDD. Since the second lines PL2 have the mesh structure, the driving voltage ELVDD may be evenly supplied throughout the entire display area DA (see FIG. 1).

Since the plurality of via holes VH overlap the first lines PL1, the plurality of via holes VH may be arranged in the second direction along the first lines PL1.

In some exemplary embodiments, the plurality of via holes VH arranged in the second direction may be arranged so that one of the via holes VH may be arranged for every two pixels PX arranged in the second direction. For example, each of the via holes VH arranged along the first column 1M is arranged for each blue pixel B and each red pixel R, e.g., every two pixels PX. The via holes VH in the second column 2M are each provided for every two green pixels G1 and G2.

From another point of view, the green pixels G, e.g., the first green pixels G1 and the second green pixels G2, are alternately arranged in the first direction, two via holes VH are arranged adjacent to the first green pixel G1 and no via hole is arranged adjacent to the second green pixel G2. For instance, the via hole VH may be provided closer to the first green pixel G1, between two adjacent first green pixel G1 and second green pixel G2. In some exemplary embodiments, two via holes VH may be arranged adjacent to the first green pixel G1.

The first green pixel G1 and the second green pixel G2 may be alternately arranged in the second direction, and the via hole VH may also be arranged adjacent to the first green pixel G1 in the second direction.

In some exemplary embodiments, the light-emitting region OP3 of the blue pixel B is greater than the light-emitting region OP1 of the red pixel R and the light-emitting region OP2 of the green pixel G. From this point of view, the via hole VH is arranged closer to the green pixel G or the red pixel R having a smaller light-emitting region than that of the blue pixel B. For example, the via hole VH between the blue pixel B and the green pixel G is arranged adjacent to the green pixel G having a smaller light-emitting region than that of the blue pixel B such that a distance d2 is less than a distance d1. Also, a second via hole VH2 between the blue pixel B and the red pixel R is arranged adjacent to the red pixel R such that a distance d4 is less than a distance d3.

In some exemplary embodiments, the above arrangement of the via holes VH may be introduced in order to reduce asymmetric color shift according to a side viewing angle. For instance, because the light-emitting regions and the via holes VH are arranged not overlapping each other, influence of the via holes VH may be reduced.

Hereinafter, a stacked structure of the organic light-emitting display apparatus according to some exemplary embodiments will be described with reference to FIG. 5, and influence of the via holes VH will be also described.

The substrate 110 may include, for instance, glass or a polymer resin. The polymer resin may include at least one of polyethersulfone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), and cellulose acetate propionate (CAP), or the like. The substrate 110 including the polymer resin may be flexible, rollable, and/or bendable. The substrate 110 may have a multi-layered structure including a layer including the polymer resin and an inorganic layer (not shown).

A buffer layer 111 is located on the substrate 110 to reduce or block infiltration of impurities, moisture, and/or external air from a lower portion of the substrate 110, and to provide a flat surface on the substrate 110. The buffer layer 111 may include an inorganic material, such as an oxide material or a nitride material, an organic material, or an inorganic-organic composite material, and may have a single-layered or multi-layered structure including the inorganic material and the organic material. A barrier layer (not shown) for preventing infiltration of external air may be further provided between the substrate 110 and the buffer layer 111. In some exemplary embodiments, the buffer layer 111 may include silicon oxide ($SiO_2$) or silicon nitride ($SiN_x$), but exemplary embodiments are not limited thereto.

At least one thin film transistor TFT for each of pixels R, G, and B may be on the buffer layer 111. The thin film transistor TFT of FIG. 5 may be one of the thin film transistors TFT included in the pixel circuit PC of FIG. 2A or FIG. 2B. The thin film transistor TFT may include a semiconductor layer Act, a gate electrode GE, a source electrode SE, and a drain electrode DE. If necessary, the source electrode SE and the drain electrode DE may be omitted. Also, the source electrode SE or the drain electrode DE may be connected to a data line that transmits a data signal. The gate electrode GE may be connected to a scan line that transmits a scan signal.

The semiconductor layer Act is on the buffer layer 111, and may include polysilicon. In some exemplary embodiments, the semiconductor layer Act may include amorphous silicon. In some exemplary embodiments, the semiconductor layer Act may include an oxide of at least one selected from the group consisting of indium (In), gallium (Ga), stannum (Sn), zirconium (Zr), vanadium (V), hafnium (Hf), cadmium (Cd), germanium (Ge), chrome (Cr), titanium (Ti), and zinc (Zn). The semiconductor layer Act may include a channel region, and a source region and a drain region having higher carrier concentrations on opposite sides of the channel region. The source region and the drain region may be doped with impurities.

A first gate insulating layer 112 may cover the semiconductor layer Act. The first gate insulating layer 112 may include an inorganic insulating material, such as at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The first gate insulating layer 112 may have a single-layered or a multi-layered structure including the inorganic insulating material.

The gate electrode GE is on the first gate insulating layer 112 to overlap the semiconductor layer Act. The gate electrode GE may include at least one of molybdenum (Mo), aluminum (Al), copper (Cu), titanium (Ti), etc., and may have a single-layered or multi-layered structure. As an example, the gate electrode GE may include a single layer including Mo.

The second gate insulating layer 113 may cover the gate electrode GE. The second gate insulating layer 113 may include an inorganic insulating material, such as at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The second gate insulating layer 113 may have a single-layered or a multi-layered structure including the inorganic insulating material.

An upper electrode Cst2 of the storage capacitor Cst may be on the second gate insulating layer 113. The upper electrode Cst2 may overlap the gate electrode GE thereunder. Here, the gate electrode GE and the upper electrode Cst overlapping each other with the second gate insulating layer 113 therebetween may configure the storage capacitor Cst. As such, the gate electrode GE may function as a lower electrode Cst1 of the storage capacitor Cst. From this point of view, the storage capacitor Cst may overlap the thin film transistor TFT. However, one or more exemplary embodiments are not limited thereto. For instance, the storage capacitor Cst may not overlap the thin film transistor TFT.

The upper electrode Cst2 may include at least one of aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and/or copper (Cu) in a single-layered or multi-layered structure.

The interlayer insulating layer 115 may cover the upper electrode Cst2. The interlayer insulating layer 115 may include an insulating material, such as at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The interlayer insulating layer 115 may have a single-layered or a multi-layered structure including the inorganic insulating material.

The source electrode SE and the drain electrode DE may be on the interlayer insulating layer 115. The source electrode SE and the drain electrode DE may include a conductive material including at least one of Mo, Al, Cu, Ti, etc., and may have a single-layered or multi-layered structure including the aforementioned materials. For example, the source electrode SE and the drain electrode DE may each have a multi-layered structure including Ti/Al/Ti.

The first line PL1 may be arranged on the interlayer insulating layer 115. For instance, the first line PL1 may include the same material and at the same layer as those of the source electrode SE and the drain electrode DE. The first line PL1 may include a conductive material including at least one of molybdenum (Mo), aluminum (Al), copper (Cu), titanium (Ti), etc., and may have a single-layered or multi-layered structure. The first line PL1 transmits the driving voltage ELVDD and may be arranged for each of the blue and green pixels B and G. The first line PL1 may overlap the light-emitting openings OP2 and OP3 of the pixel defining layer 119 that are the light-emitting regions of the pixels G and B. Since a first via layer 117 and a second via layer 118 are between the first line PL1 and pixel electrodes 221G and 221B, the first line PL1 does not affect the light-emitting region of the pixel even when the first line PL1 overlaps the light-emitting region of the pixel.

The first via layer 117 may cover the source electrode SE, the drain electrode DE, and the first line PL1. The first via layer 117 may have a flat upper surface so that the second line PL2 that will be arranged thereon may be planarized.

The first via layer 117 may include a single-layered or multi-layered structure including at least one of an organic material and an inorganic material. The first via layer 117 may include at least one of a general universal polymer (e.g., benzocyclobutene (BCB), polyimide, hexamethyldisiloxane (HMDSO), poly(methyl methacrylate) (PMMA), or polystyrene (PS)), polymer derivatives having phenol groups, acryl-based polymer, imide-based polymer, aryl ether-based polymer, amide-based polymer, fluoride-based polymer, p-xylene-based polymer, vinyl alcohol-based polymer, and blends thereof. The first via layer 117 may include an inorganic insulating material, such as at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$).

The second line PL2 is arranged on the first via layer 117. The second line PL2 may contact the first line PL1 via a via hole VH penetrating through the first via layer 117. The via hole VH between the blue pixel B and the green pixel G may be arranged more adjacent to the green pixel G such that a distance d1 is greater than a distance d2.

The second line PL2 may include at least one of aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and/or copper (Cu) in a single-layered or multi-layered structure.

A second via layer 118 may cover the second line PL2. The second via layer 118 may include a single-layered or multi-layered structure including at least one of an organic material and an inorganic material. The second via layer 118 may include at least one of a general universal polymer (e.g., benzocyclobutene (BCB), polyimide, hexamethyldisiloxane (HMDSO), poly(methyl methacrylate) (PMMA), or polystyrene (PS)), polymer derivatives having phenol groups, acryl-based polymer, imide-based polymer, aryl ether-based polymer, amide-based polymer, fluoride-based polymer, p-xylene-based polymer, vinyl alcohol-based polymer, and blends thereof. The second via layer 118 may include an inorganic insulating material, such as at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$).

The pixel electrodes 221B and 221G are arranged on the second via layer 118. The pixel electrodes 221B and 221G may include a conductive oxide, such as indium tin oxide (ITO), indium zinc oxide (IZO), zinc oxide (ZnO), indium oxide ($In_2O_3$), indium gallium oxide, or aluminum zinc oxide (AZO). In some exemplary embodiments, the pixel electrodes 221B and 221G may include a reflective layer including at least one of silver (Ag), magnesium (Mg), aluminum (Al), platinum (Pt), palladium (Pd), gold (Au), nickel (Ni), neodymium (Nd), iridium (Ir), and chrome (Cr), or a compound thereof. In some exemplary embodiments, the pixel electrodes 221B and 221G may further include a layer including ITO, IZO, ZnO, or $In_2O_3$ on and/or under the reflective layer. In some exemplary embodiments, the pixel electrodes 221B and 221G may include a stack structure, such as, a stack structure including ITO/Ag/ITO.

The pixel defining layer 119 may cover boundaries of each of the pixel electrodes 221B and 221G. The pixel defining layer 119 includes the light-emitting openings OP2 and OP3 respectively corresponding to the pixels G and B. For instance, the light-emitting openings OP2 and OP3 may at least partially expose the pixel electrodes 221B and 221G to define light-emitting regions of the pixels G and B. That is, the light-emitting openings OP2 and OP3 may be referred to as the light-emitting regions OP2 and OP3 of the pixels G and B.

The pixel defining layer 119 increases a distance between an edge of each of the pixel electrodes 221B and 221G and an opposite electrode 223 on the pixel electrodes 221B and 221G to prevent generation of an arc at the edge of the pixel electrodes 221B and 221G. The pixel defining layer 119 may include an organic insulating material, such as at least one of polyimide, polyamide, an acrylic resin, BCB, HMDSO, and a phenol resin, and may be obtained by a spin coating method, etc.

Intermediate layers 222B and 222G each including an organic light-emitting layer are arranged on the pixel electrodes 221B and 221G that are exposed by the light-emitting openings OP2 and OP3 in the pixel defining layer 119. The intermediate layers 222G and 222B may each include a low-molecular weight organic material or a polymer material. When the intermediate layers 222B and 222G includes a low-molecular weight material, the intermediate layers 222B and 222G may include a hole injection layer (HIL), a hole transport layer (HTL), an emission layer (EML), an electron transport layer (ETL), and an electron injection layer (EIL) in a single or multiple-layered structure. Examples of the low-molecular weight material may include copper phthalocyanine (CuPc), N,N'-Di(naphthalene-1-yl)-N,N'-diphenyl-benzidine (NPB), and tris-8-hydroxyquinoline aluminum ($Alq_3$). The aforementioned layers may be manufactured by a vacuum deposition method.

When the intermediate layers 222G and 222B include a polymer material, the intermediate layers 222G and 222B may include an HTL and an EML. Here, the HTL may include poly(3,4-ethylenedioxythiophene) (PEDOT), and the EML may include a poly(p-phenylene vinylene) (PPV)-based or polyfluorene-based polymer material. The intermediate layers 222G and 222B may be arranged using a screen printing method, an inkjet printing method, a laser induced thermal imaging (LITI) method, etc.

However, the intermediate layers 222G and 222B are not limited to the aforementioned exemplary embodiments, but may have various structures. In addition, the intermediate layers 222G and 222B may include a layer integrally provided throughout a plurality of pixel electrodes 221G and 221B, or may include a layer patterned to correspond to each of the plurality of pixel electrodes 221G and 221B.

The opposite electrode 223 is arranged on the intermediate layers 222G and 222B. The opposite electrode 223 may include a conductive material having a low work function. For example, the opposite electrode 223 may include a (semi-)transparent layer including at least one of Ag, Mg, Al, Pt, Pd, Au, Ni, Nd, Ir, Cr, lithium (Li), and calcium (Ca), or an alloy thereof. In some exemplary embodiments, the opposite electrode 223 may further include a layer including ITO, IZO, ZnO, or $In_2O_3$ on the (semi-)transparent layer including at least one of the aforementioned materials.

The opposite electrode 223 may be integrally provided throughout a plurality of organic light-emitting diodes OLED(G) and OLED(B) to correspond to the plurality of pixel electrodes 221G and 221B.

Although not shown in the drawings, a capping layer may be provided on the opposite electrode 223 to improve a light extracting efficiency while protecting the opposite electrode 223. The capping layer may include, for example, lithium fluoride (LiF). In some exemplary embodiments, the capping layer may include an inorganic insulating material, such as silicon nitride, and/or an organic insulating material. In some exemplary embodiments, the capping layer may be omitted.

Also, the organic light-emitting display apparatus according to some exemplary embodiments may further include an encapsulation member for protecting the plurality of organic light-emitting diodes OLED.

The encapsulation member may include a thin film encapsulation layer including at least one inorganic encapsulation layer and at least one organic encapsulation layer. Here, the inorganic encapsulation layer may include one or more inorganic insulating materials, such as at least one of aluminum oxide, titanium oxide, tantalum oxide, hafnium oxide, zinc oxide, silicon oxide, silicon nitride, and silicon oxynitride. The organic encapsulation layer may include a polymer-based material. The polymer-based material may include at least one of an acryl-based resin, an epoxy-based resin, polyimide, polyethylene, etc. The thin film encapsulation layer may have a structure in which a first inorganic encapsulation layer, an organic encapsulation layer, and a second inorganic encapsulation layer are stacked.

Alternatively, a sealing substrate bonded to the substrate 110 via a sealant or a frit may be used as the encapsulation member.

Components, such as an input sensing member for sensing a touch input, an anti-reflection member including a polarizer and a retarder, a color filter, a black matrix, a transparent window, and/or the like may be further arranged on the encapsulation member.

In some exemplary embodiments, the via hole VH is arranged not to overlap the light-emitting openings OP2 and OP3 of the pixel defining layer 119. Since the via hole VH is provided, a curve may be vertically formed in an upper surface of the second via layer 118 according to the shape of the via hole VH and the second line PL2 arranged in the via hole VH such as depicted in region R1 of FIG. 5. However, since the via holes VH do no overlap the light-emitting regions, the via holes VH do not affect the light-emitting regions.

When the first line PL1 and the second line PL2 passing through the blue pixel B are in contact with each other via an additional via hole VH' as shown in FIG. 6, the additional via hole VH' may be arranged overlapping, for instance, the third opening OP3, that is, the light-emitting region of the blue pixel B because the light-emitting region of the blue pixel B is greater than that of the green pixel G. Accordingly, a curve may be formed in an upper surface of the second via layer 118 (e.g., a region R2 in FIG. 6), and the curve may affect the pixel electrode 221B and/or the intermediate layer 222B, and the opposite electrode 223 of the blue pixel B.

The curve or step formed in the light-emitting region may cause diffused reflection and/or bilateral asymmetric reflection of light generated from the intermediate layer 222B, and accordingly, a color visibility may vary depending on left or right side viewing angles. As such, a color shift may be asymmetric between the left and right side views.

To reduce the above effect, the via hole VH connecting the first line PL1 and the second line PL2 is arranged not to overlap the light-emitting region of the pixels PX in various exemplary embodiments. For instance, each one of the via holes VH arranged in the second direction are arranged for every two pixels. Alternatively, the via hole VH is arranged adjacent to a pixel having a smaller light-emitting region, rather than a pixel having a greater light-emitting region. Alternatively, the via hole VH may be arranged closer to a first green pixel G1, between the first green pixel G1 and a second green pixel G2 arranged alternately along a direction.

Figure 7A:
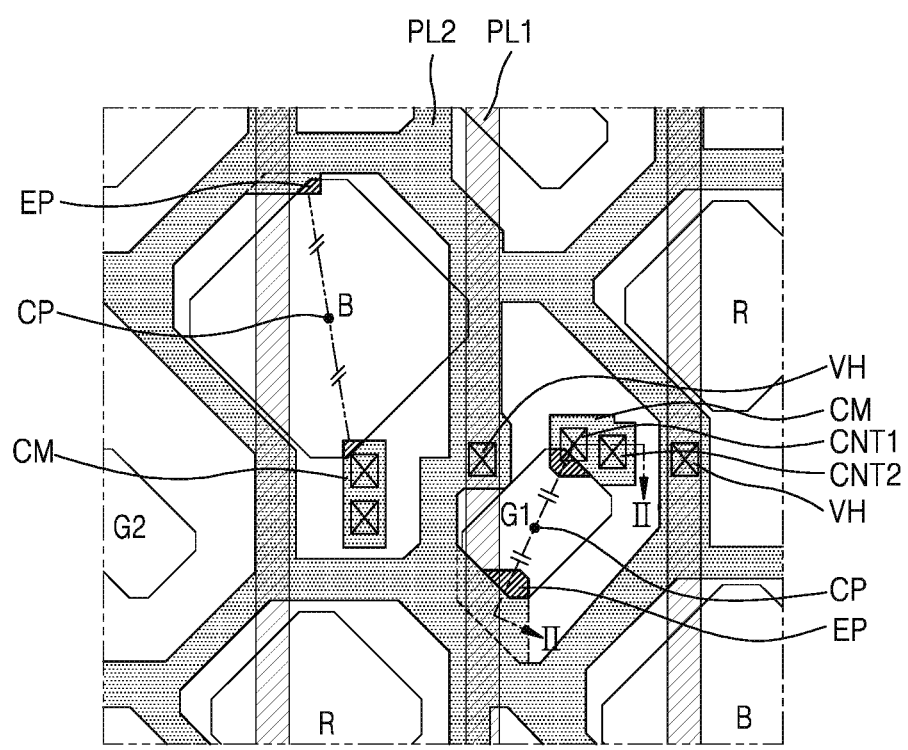
FIG. 7A is a layout of an organic light-emitting display apparatus according to some exemplary embodiments.
Figure 7A:
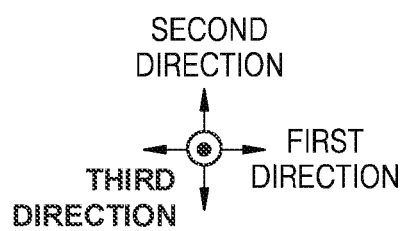
Figure 7B:
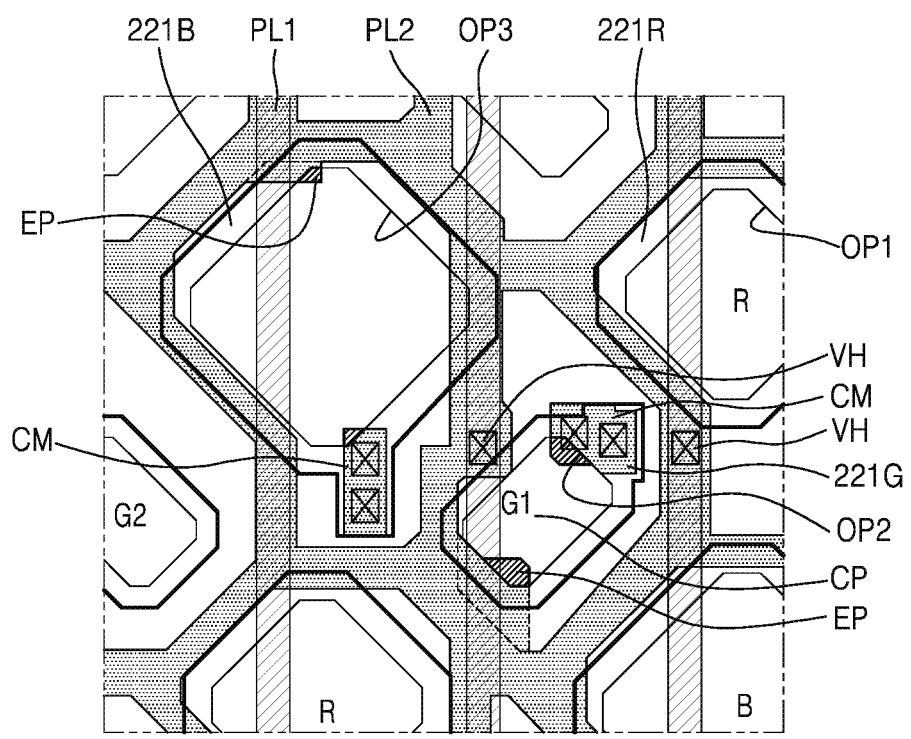
FIG. 7B is a layout of a pixel electrode in addition to FIG. 7A according to some exemplary embodiments.
Figure 7B:
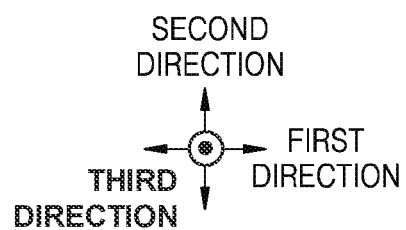
Figure 7C:
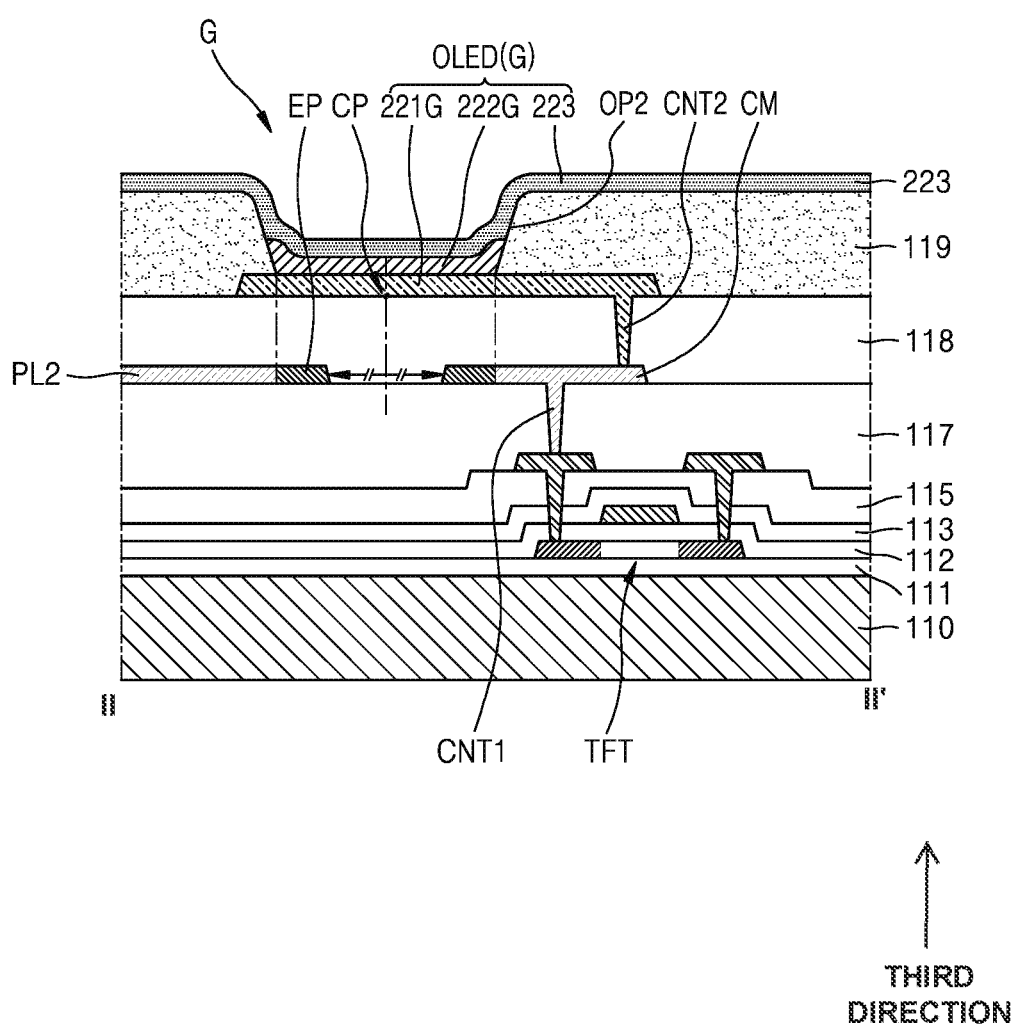
FIG. 7C is a cross-sectional view taken along sectional line II-II' in FIG. 7A according to some exemplary embodiments.

FIG. 7A is a layout of an organic light-emitting display apparatus according to some exemplary embodiments. FIG. 7B is a layout of a pixel electrode in addition to FIG. 7A according to some exemplary embodiments. FIG. 7C is a cross-sectional view taken along sectional line II-II' in FIG. 7A according to some exemplary embodiments. In FIGS. 7A to 7C, like reference numerals as those in FIGS. 4 and 5 denote the same elements, and detailed descriptions thereof are primarily omitted.

Referring to FIGS. 7A to 7C, the organic light-emitting display apparatus according to some exemplary embodiments may further include a connecting electrode CM on the first via layer 117.

The connecting electrode CM may connect the organic light-emitting diode OLED to the thin film transistor TFT. For instance, the connecting electrode CM may connect the pixel electrodes 221B and 221G of the organic light-emitting diode OLED to the source electrode SE or the drain electrode DE of the thin film transistor TFT. Referring to FIG. 7C, the connecting electrode CM may be connected to the source electrode or the drain electrode of the thin film transistor TFT via a first contact hole CNT1 that penetrates through the first via layer 117, and the pixel electrode 221G may be connected to the connecting electrode CM via a second contact hole CNT2 that penetrates through the second via layer 118.

The connecting electrode CM is arranged at the same layer as the second line PL2, and may include the same material as that of the second line PL2. For example, the connecting electrode CM may include at least one of aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and/or copper (Cu) in a single-layered or multi-layered structure.

The connecting electrode CM may partially overlap the light-emitting openings OP2 and OP3 of the pixel defining layer 119, e.g., the light-emitting regions, on a plan. In some exemplary embodiments, based on a center point CP in each of the light-emitting openings OP2 and OP3, an extension EP extending from the second line PL2 is arranged opposite to the connecting electrode CM. A distance from the center point CP to the extension EP may be substantially the same as a distance from the center point CP to the connecting electrode CM. Also, an overlapping area between the extension EP and the light-emitting openings OP2 and OP3 may be equal to an overlapping area between the connecting electrode CM and the light-emitting openings OP2 and OP3.

When the extension EP is not provided, an asymmetric curve or step may be formed on a bottom surface of the light-emitting openings OP2 and OP3 due to the connecting electrode CM arranged on the first via layer 117. Accordingly, an asymmetric color shift may occur with respect to the side visibility. However, according to various exemplary embodiments, since the extension EP is provided opposite to the connecting electrode CM based on the center point CP, the asymmetric color shift in the side visibility may be reduced.

In addition, as shown in FIG. 7B, edges of each of the pixel electrodes 221R, 221G, and 221B according to various exemplary embodiments may partially overlap the second line PL2. However, since the overlapping edges of the pixel electrodes 221R, 221G, and 221B are not the light-emitting regions, the optical characteristics of the light-emitting regions may not be affected even when the pixel electrodes 221R, 221G, and 221B partially overlap the second line PL2.

Figure 8:
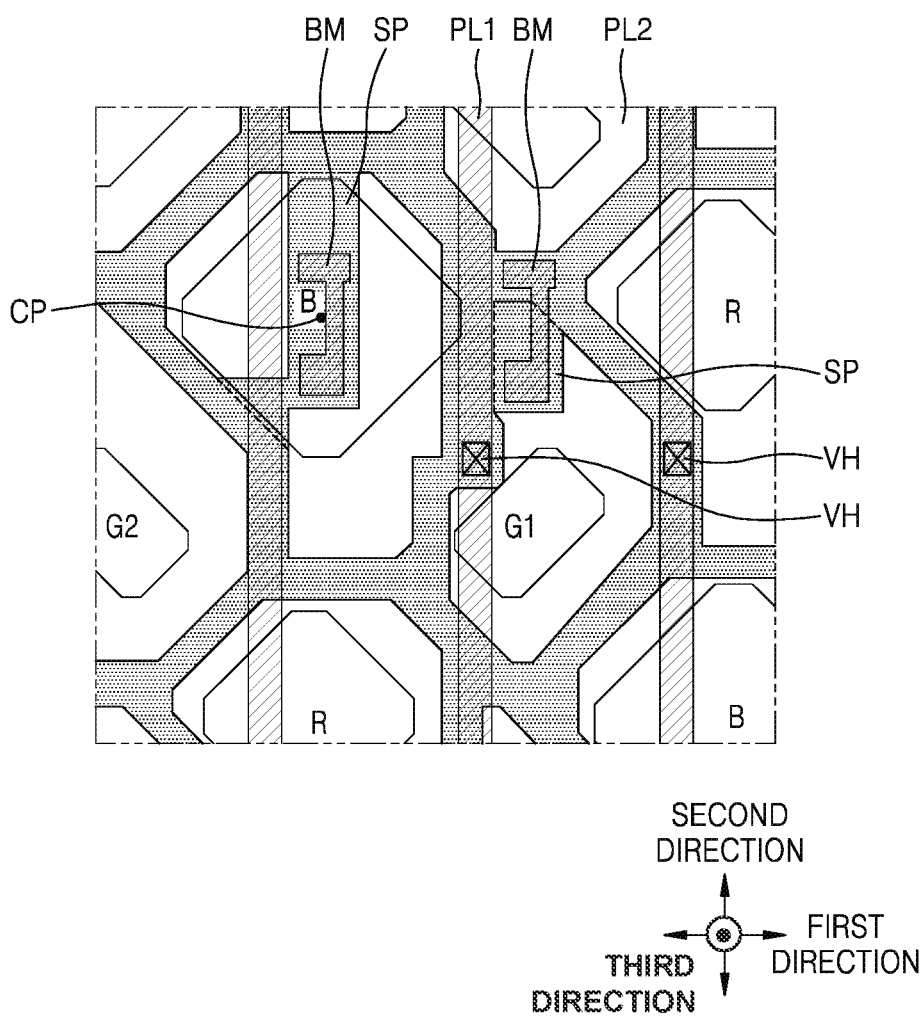
FIG. 8 is a layout of an organic light-emitting display apparatus according to some exemplary embodiments.

FIG. 8 is a layout of an organic light-emitting display apparatus according to some exemplary embodiments. In FIG. 8, like reference numerals as those in FIG. 4 denote the same components, and detailed descriptions thereof are primarily omitted.

Referring to FIG. 8, the organic light-emitting display apparatus may further include a node electrode BM and a shield portion SP overlapping the node electrode BM.

The node electrode BM may be at the same layer as the first line PL1 to be spaced apart from the first line PL1. The node electrode BM may include the same material as that of the first line PL1. For example, the node electrode BM may include at least one of aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and/or copper (Cu) in a single-layered or multi-layered structure.

The node electrode BM may be a bridge electrode for connecting the thin film transistors of the pixel circuit PC (see FIGS. 2A and 2B). The node electrode BM may overlap the center point of the light-emitting opening OP2. The node electrode BM may transmit signals, and cross-talk may occur between adjacent thin film transistors or between adjacent pixel circuits PC due to the signals. However, according to various exemplary embodiments, the shield portion SP extending from the second line PL2 is provided overlapping the node electrode BM to reduce the occurrence of the cross-talk due to the signals.

There may be a plurality of shield portions SP. Some of the shield portions SP overlap the light-emitting opening OP3, and some other of the shield portions SP may not overlap the light-emitting openings OP2 and OP3.

The shield portion SP overlapping the light-emitting opening OP3 may overlap the node electrode BM, and may correspond to the center point of the light-emitting opening OP3. The aforementioned arrangement is provided taking into account the asymmetric color shift, as well as the cross-talk. In various exemplary embodiments, the shield portion SP extending from the second line PL2 is arranged at the center of the light-emitting opening OP3, and, thus, the color shift effects may be shown equally at the left and right sides.

According to one or more exemplary embodiments, an asymmetric color shift of the organic light-emitting display apparatus may be reduced while maintaining uniform characteristics of the pixels, and uniformity in a right wide area display (WAD) and a left WAD may be obtained. However, the scope of the disclosure is not limited to the aforementioned effects.

Although certain exemplary embodiments and implementations have been described herein, other embodiments and modifications will be apparent from this description. Accordingly, the inventive concepts are not limited to such embodiments, but rather to the broader scope of the accompanying claims and various obvious modifications and equivalent arrangements as would be apparent to one of ordinary skill in the art.

What is claimed is:
1. An organic light-emitting display apparatus comprising:
   a substrate;
   pixels arranged on the substrate in a first direction and a second direction intersecting the first direction, the pixels comprising organic light-emitting diodes, the organic light-emitting diodes comprising pixel electrodes;
   a pixel defining layer covering edges of the pixel electrodes, the pixel defining layer defining light-emitting regions via openings partially exposing the pixel electrodes;
   a first insulation layer and a second insulation layer between the pixel electrodes and the substrate;
   first lines extending in the second direction between the first insulation layer and the substrate; and
   a second line between the second insulation layer and the first insulation layer,
   wherein:
   the second line contacts the first lines through via holes; and
   each via hole among the via holes is provided every two pixels arranged in the second direction among the pixels.
2. The organic light-emitting display apparatus of claim 1, wherein the second line has a mesh structure comprising openings corresponding to the light-emitting regions of the pixels.
3. The organic light-emitting display apparatus of claim 1, wherein the first lines at least overlap the light emitting regions and the second line at least partially extends around the light emitting regions.
4. The organic light-emitting display apparatus of claim 1, wherein:
   the pixels comprise first pixels, second pixels, and third pixels;
   the first, second, and third pixels are configured to emit light of different colors from one another;
   an area of a light-emitting region in each of the third pixels is greater than an area of a light-emitting region in each of the first pixels and an area of a light-emitting region in each of the second pixels; and
   the via holes are arranged closer to the light-emitting regions of the first pixels and the second pixels than the light-emitting regions of the third pixels.

5. The organic light-emitting display apparatus of claim 1, wherein:
the pixels comprise first green pixels and second green pixels that are alternately arranged in the first direction; and
the via holes are arranged closer to the first green pixels than the second green pixels.

6. The organic light-emitting display apparatus of claim 1, wherein the via holes do not overlap the light-emitting regions of the pixels.

7. The organic light-emitting display apparatus of claim 1, wherein the pixels are arranged in a PenTile® matrix structure.

8. The organic light-emitting display apparatus of claim 1, wherein the first lines overlap the light-emitting regions of some of the pixels.

9. The organic light-emitting display apparatus of claim 1, wherein the second line at least partially overlaps some of the pixel electrodes.

10. The organic light-emitting display apparatus of claim 1, wherein:
each pixel of the pixels further comprises a thin film transistor;
the organic light-emitting display apparatus further comprises a connecting electrode at a same layer as the second line, the connecting electrode connecting a pixel electrode among the pixel electrodes to a thin film transistor among the thin film transistors;
an end of a light-emitting region of a first pixel among the pixels overlaps the connecting electrode; and
an opposite end of the light-emitting region of the first pixel overlaps an extension extending from the second line.

11. The organic light-emitting display apparatus of claim 10, wherein an overlapping area between the connecting electrode and the light-emitting region of the first pixel is equal to an overlapping area between the extension and the light-emitting region of the first pixel.

12. The organic light-emitting display apparatus of claim 1, further comprising:
a node electrode at a same layer as the first line; and
a shield portion extending from the second line,
wherein the shield portion entirely overlaps the node electrode.

13. The organic light-emitting display apparatus of claim 12, wherein:
the node electrode overlaps the light-emitting regions of some of the pixels; and
the shield portion corresponds to a center portion of the light-emitting regions in some of the pixels.

14. An organic light-emitting display apparatus comprising:
a substrate;
pixels arranged on the substrate in a first direction and a second direction intersecting the first direction, the pixels comprising organic light-emitting diodes and the organic light-emitting diodes comprising pixel electrodes;
a pixel defining layer covering edges of the pixel electrodes, the pixel defining layer defining light-emitting regions via openings partially exposing the pixel electrodes;
a first insulation layer and a second insulation layer between the pixel electrodes and the substrate;
first lines extending in the second direction between the first insulation layer and the substrate; and
a second line between the second insulation layer and the first insulation layer,
wherein:
the second line contacts the first lines through via holes;
the pixels comprise a first pixel, a second pixel, and a third pixel, each of which is configured to emit light of a different color; and
the via holes are provided closer to the light-emitting regions of the first pixel and the second pixel than to the third pixel.

15. The organic light-emitting display apparatus of claim 14, wherein the light-emitting region of the third pixel is greater than the light-emitting region of the first pixel and the light-emitting region of the second pixel.

16. The organic light-emitting display apparatus of claim 14, wherein the pixels are arranged in a PenTile matrix structure.

17. The organic light-emitting display apparatus of claim 16, wherein:
the second pixel is a green pixel comprising a first green pixel and a second green pixel arranged alternately with one another; and
the via holes are provided closer to the first green pixel than to the second green pixel.

18. The organic light-emitting display apparatus of claim 14, wherein the first line overlaps some of the light-emitting regions.

19. The organic light-emitting display apparatus of claim 14, further comprising a connecting electrode at a same layer as the second line, the connecting electrode being connected to some of the pixel electrodes via a contact hole,
wherein:
an end of the light-emitting region of the first pixel overlaps the connecting electrode; and
an opposite end of the light-emitting region of the first pixel overlaps an extension extending from the second line.

20. The organic light-emitting display apparatus of claim 14, further comprising:
a node electrode at a same layer as the first line; and
a shield portion extending from the second line,
wherein the shield portion entirely overlaps the node electrode.

* * * * *